US008922689B2

(12) United States Patent
Ueno et al.

(10) Patent No.: US 8,922,689 B2
(45) Date of Patent: Dec. 30, 2014

(54) SOLID-STATE IMAGING ELEMENT HAVING IMAGE SIGNAL OVERFLOW PATH

(75) Inventors: Takahisa Ueno, Kanagawa (JP); Kazuya Yonemoto, Tokyo (JP); Ryoji Suzuki, Kanagawa (JP); Koichi Shiono, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/565,383

(22) Filed: Aug. 2, 2012

(65) Prior Publication Data
US 2012/0292486 A1 Nov. 22, 2012

Related U.S. Application Data

(63) Continuation of application No. 13/067,112, filed on May 10, 2011, now Pat. No. 8,743,257, which is a continuation of application No. 10/945,519, filed on Sep. 20, 2004, now Pat. No. 8,023,024, which is a continuation of application No. 09/327,523, filed on Jun. 8, 1999, now Pat. No. 7,116,365.

(30) Foreign Application Priority Data

Jun. 8, 1998 (JP) .................................... 10-159050

(51) Int. Cl.
*H04N 5/335* (2011.01)
*H04N 5/3745* (2011.01)
*H01L 27/146* (2006.01)
*H04N 3/14* (2006.01)

(52) U.S. Cl.
CPC ...... *H04N 5/37457* (2013.01); *H01L 27/14609* (2013.01); *H04N 3/1512* (2013.01); *H04N 3/155* (2013.01); *H04N 5/335* (2013.01)
USPC ....................................................... 348/308

(58) Field of Classification Search
CPC ....... H04N 5/335; H04N 3/155; H04N 5/378; H04N 3/1512; H04N 5/37457; H01L 27/14643; H01L 27/14609
USPC ......... 348/308, 307, 311, 301, 304, 292, 294; 257/291, 292, 239; 250/208.1
See application file for complete search history.

(56) References Cited

U.S. PATENT DOCUMENTS 4,223,330 A 9/1980 Koike et al.
4,353,084 A 10/1982 Herbst et al.
(Continued)

FOREIGN PATENT DOCUMENTS

EP 0757475 2/1997
EP 0908957 4/1999
(Continued)

OTHER PUBLICATIONS

Partial European Search Report issued Nov. 28, 2011 for corresponding European Application No. 07022774.9.
(Continued)

*Primary Examiner* — Aung S Moe
(74) *Attorney, Agent, or Firm* — Rader, Fishman & Grauer PLLC

(57) ABSTRACT

Since the great number of elements constituting a unit pixel having an amplification function would hinder reduction of pixel size, unit pixel n,m arranged in a matrix form is comprised of a photodiode, a transfer switch for transferring charges stored in the photodiode, a floating diffusion for storing charges transferred by the transfer switch, a reset switch for resetting the floating diffusion, and an amplifying transistor for outputting a signal in accordance with the potential of the floating diffusion to a vertical signal line, and by affording vertical selection pulse φVn to the drain of the reset switch to control a reset potential thereof, pixels are selected in units of rows.

16 Claims, 17 Drawing Sheets

(56) References Cited

U.S. PATENT DOCUMENTS

| | | | |
|---|---|---|---|
| 4,811,371 A | 3/1989 | Tower | |
| 4,974,239 A | 11/1990 | Miwada | |
| 5,185,771 A | 2/1993 | Anger et al. | |
| 5,262,871 A | 11/1993 | Wilder et al. | |
| 5,306,932 A | 4/1994 | Miwada | |
| 5,335,008 A | 8/1994 | Hamasaki | |
| 5,389,971 A | 2/1995 | Ishida et al. | |
| 5,452,004 A | 9/1995 | Roberts | |
| 5,608,243 A * | 3/1997 | Chi et al. | 257/249 |
| 5,698,844 A | 12/1997 | Shinohara et al. | |
| 5,719,626 A | 2/1998 | Yoneyama et al. | |
| 5,793,423 A | 8/1998 | Hamasaki | |
| 5,835,141 A | 11/1998 | Ackland et al. | |
| 5,844,760 A * | 12/1998 | Kumagai et al. | 361/58 |
| 5,867,055 A | 2/1999 | Asaumi et al. | |
| 5,886,659 A | 3/1999 | Pain et al. | |
| 5,898,168 A * | 4/1999 | Gowda et al. | 250/208.1 |
| 5,900,623 A * | 5/1999 | Tsang et al. | 250/208.1 |
| 5,920,345 A * | 7/1999 | Sauer | 348/308 |
| 5,932,902 A | 8/1999 | Yonemoto | |
| 5,933,188 A * | 8/1999 | Shinohara et al. | 348/302 |
| 5,942,774 A * | 8/1999 | Isogai et al. | 257/292 |
| 5,949,483 A | 9/1999 | Fossum et al. | |
| 5,955,753 A | 9/1999 | Takahashi | |
| 5,965,871 A | 10/1999 | Zhou et al. | |
| 5,969,758 A | 10/1999 | Sauer et al. | |
| 6,002,123 A | 12/1999 | Suzuki | |
| 6,008,486 A | 12/1999 | Stam et al. | |
| 6,031,571 A | 2/2000 | Arakawa | |
| 6,043,478 A * | 3/2000 | Wang | 250/208.1 |
| 6,064,431 A | 5/2000 | Ueno | |
| 6,115,066 A | 9/2000 | Gowda et al. | |
| 6,180,969 B1 | 1/2001 | Yang et al. | |
| 6,230,975 B1 | 5/2001 | Colley et al. | |
| 6,259,124 B1 | 7/2001 | Guidash | |
| 6,449,014 B1 | 9/2002 | Throngnumchai | |
| 6,483,541 B1 | 11/2002 | Yonemoto et al. | |
| 6,677,993 B1 * | 1/2004 | Suzuki et al. | 348/241 |
| 6,801,253 B1 | 10/2004 | Yonemoto et al. | |
| 6,946,637 B2 * | 9/2005 | Kochi et al. | 250/208.1 |
| 7,116,365 B1 * | 10/2006 | Ueno et al. | 348/308 |
| 7,218,346 B1 | 5/2007 | Nakashiba | |
| 8,023,024 B2 * | 9/2011 | Ueno et al. | 348/308 |
| 2004/0080644 A1 * | 4/2004 | Suzuki et al. | 348/301 |
| 2005/0012839 A1 * | 1/2005 | Matsunaga et al. | 348/308 |
| 2005/0088548 A1 * | 4/2005 | Suzuki et al. | 348/241 |
| 2006/0227233 A1 * | 10/2006 | Fossum | 348/308 |
| 2012/0292486 A1 * | 11/2012 | Ueno et al. | 250/208.1 |

FOREIGN PATENT DOCUMENTS

| | | |
|---|---|---|
| JP | 01-243675 | 9/1989 |
| JP | 04-154283 A | 5/1992 |
| JP | 04-290081 | 10/1992 |
| JP | 59-215180 | 12/1994 |
| JP | 07-284024 | 10/1995 |
| JP | 09-139486 | 5/1997 |
| JP | 09-252434 | 9/1997 |
| JP | 09-321236 A | 12/1997 |
| JP | 10-093066 | 4/1998 |
| JP | 10-233964 | 9/1998 |

OTHER PUBLICATIONS

Japanese Office Action issued Nov. 28, 2011 for corresponding Japanese Application No. 07033774.9-1241/1892950.

Extended European Search Report issued Mar. 26, 2012 for corresponding European Application No. 07 02 2774.

* cited by examiner

F I G. 4A   t<t1 NON-SELECTION STATE
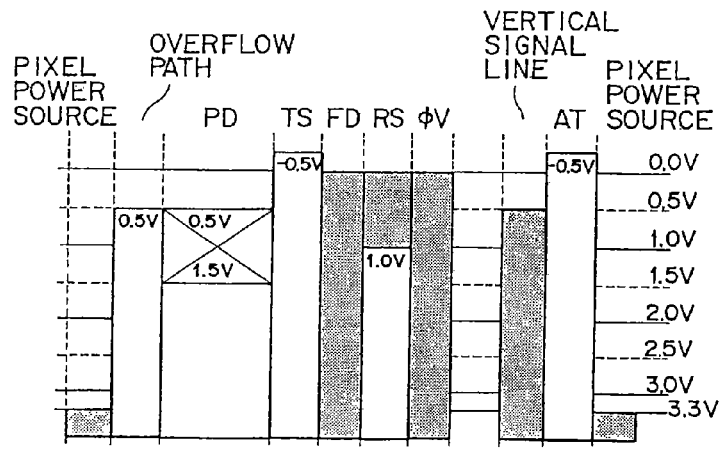
F I G. 4B   t1<t<t2 FD RESET
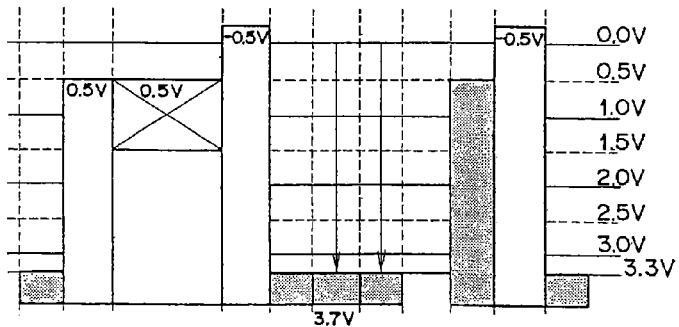
F I G. 4C   t2<t<t3 OFFSET LEVEL (NOISE LEVEL) READ-OUT
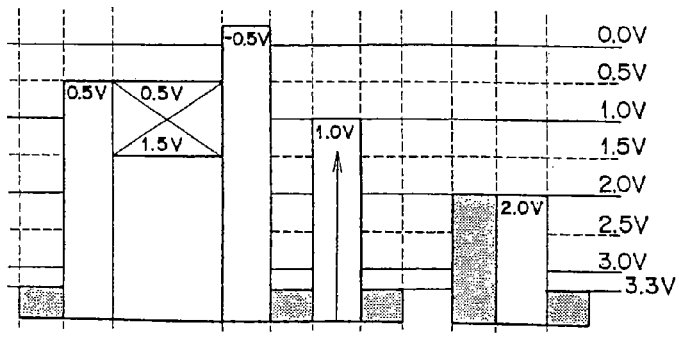

FIG. 5A  t3<t<t4  TRANSFER OF SIGNAL CHARGE FROM PD TO FD
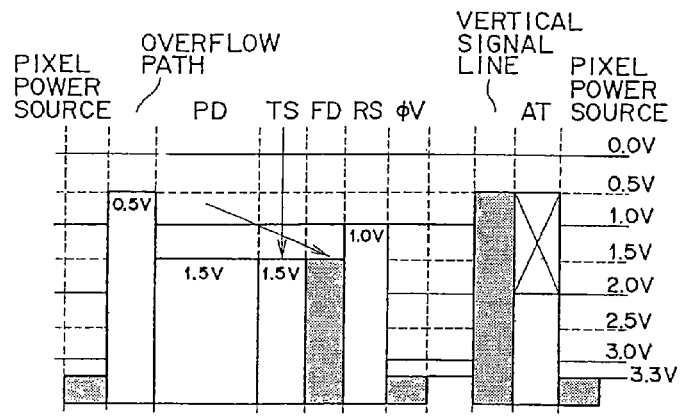
FIG. 5B  t4<t<t5  SIGNAL LEVEL READ-OUT
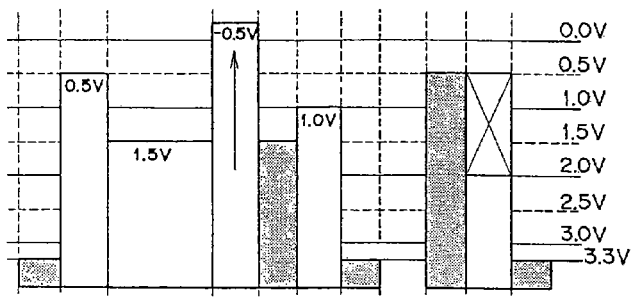
FIG. 5C  t6<t  NON-SELECTION STATE
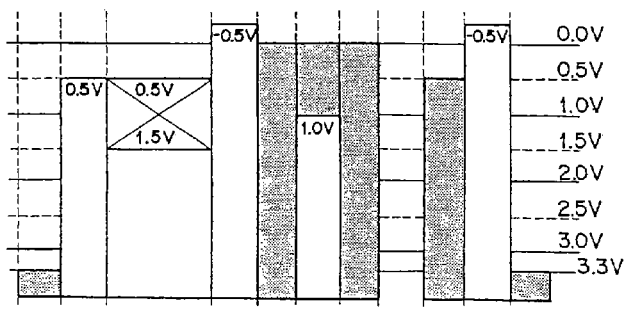

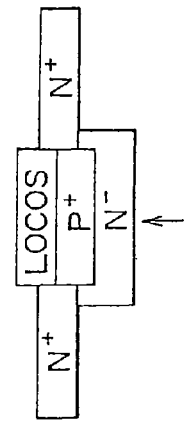
F I G. 6C
N⁻ REGION IS POSITIVELY FORMED
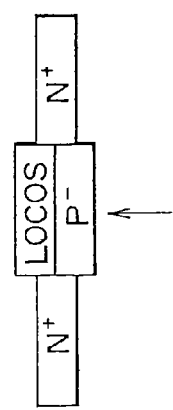
F I G. 6B
THE DENSITY OF P REGION OF CHANNEL STOP IS REDUCED
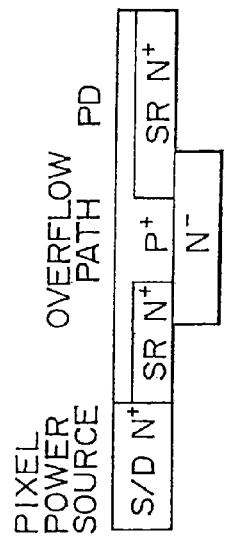
F I G. 6E
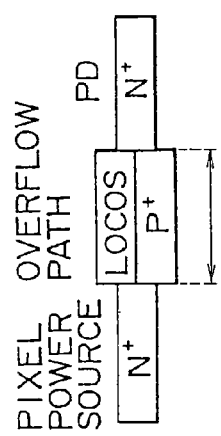
F I G. 6A
THE DISTANCE IS REDUCED
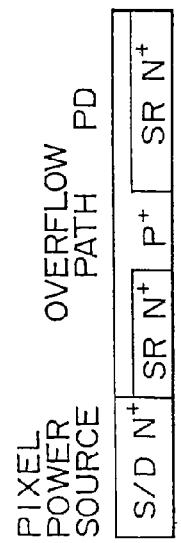
F I G. 6D

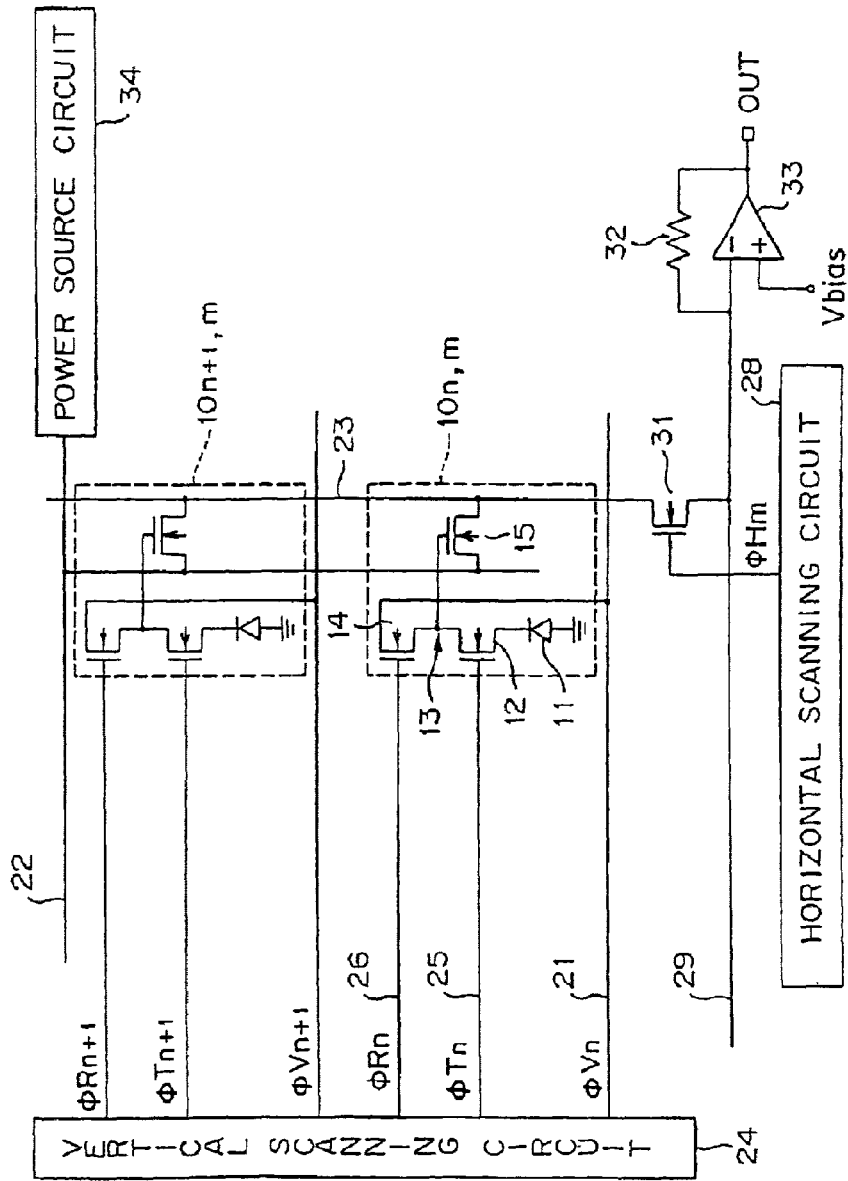

F I G. 13A  t<t1 NON-SELECTION STATE
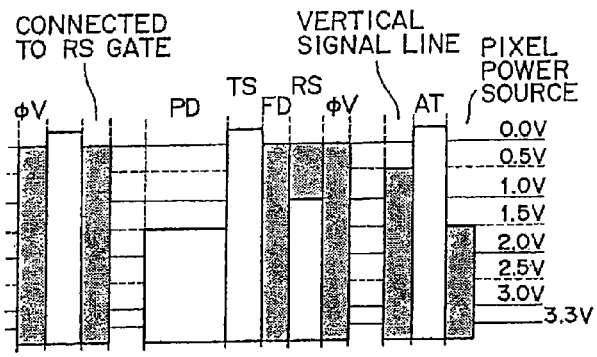
F I G. 13B  t1<t<t2 SELECTION
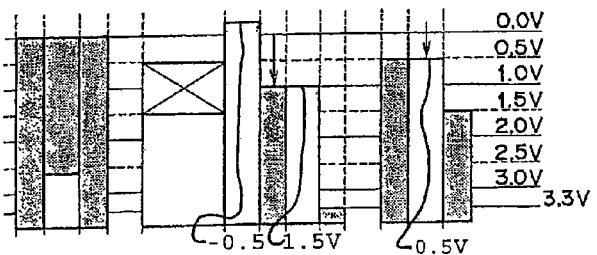
F I G. 13C  t2<t<t3 FD RESET
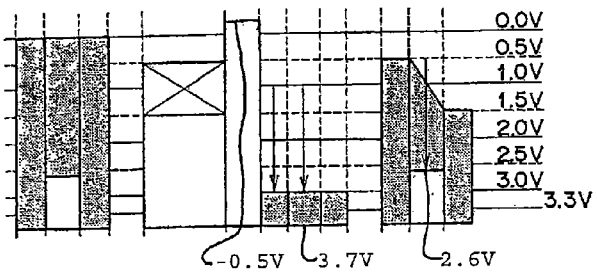
F I G. 13D  t3<t<t4 FD RESET
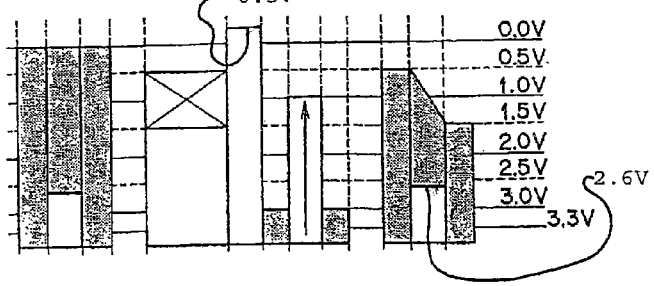

F I G. 14A  t4<t<t5 TRANSFER OF STORED CHARGES FROM PD TO FD
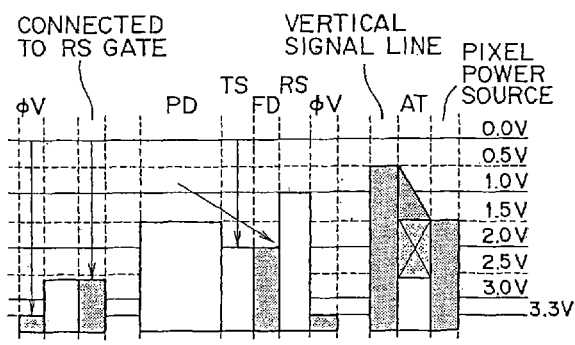
F I G. 14B  t5<t<t6 SIGNAL LEVEL READ-OUT
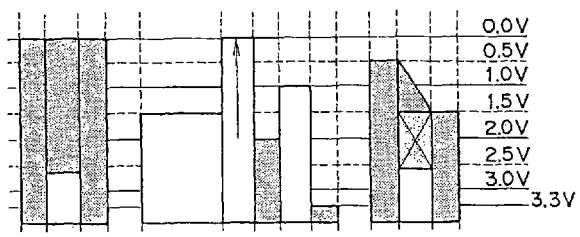
F I G. 14C  t7<t NON-SELECTION
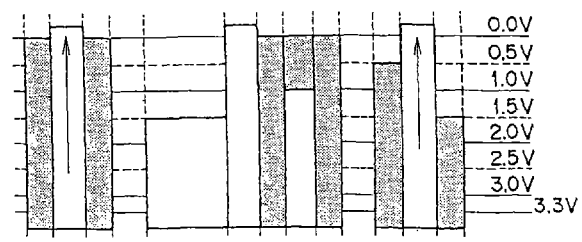

FIG. 15A t<t1
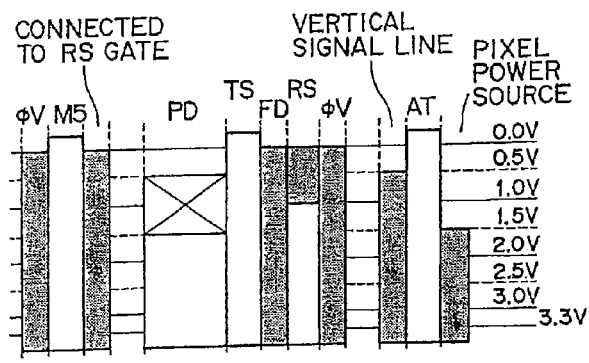
FIG. 15B t1<t<t2
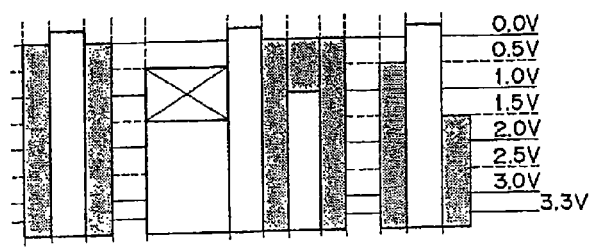
FIG. 15C t2<t<t3
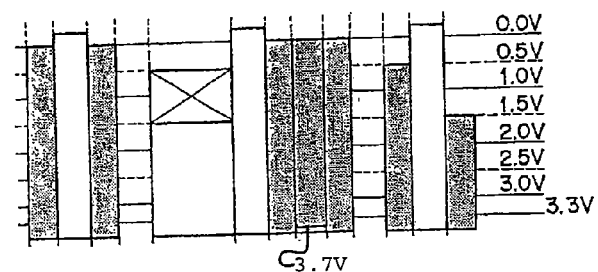
FIG. 15D t3<t<t4
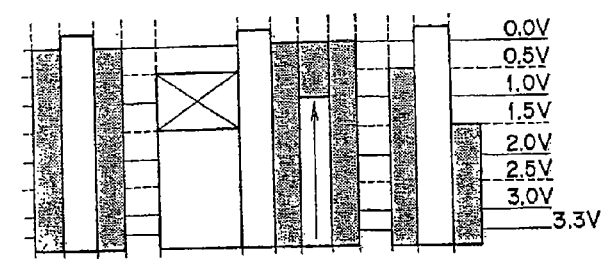

F I G. 16A  t4 < t < t5
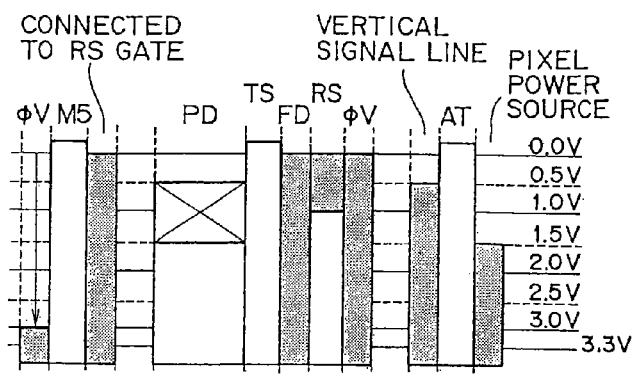
F I G. 16B  t5 < t < t6
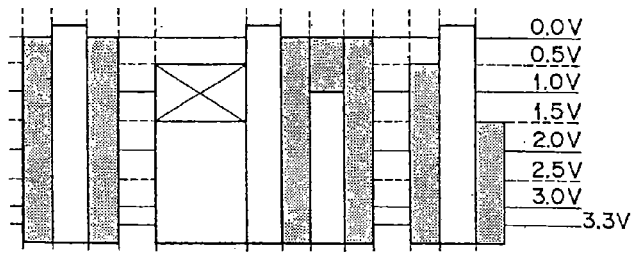
F I G. 16C  t7 < t
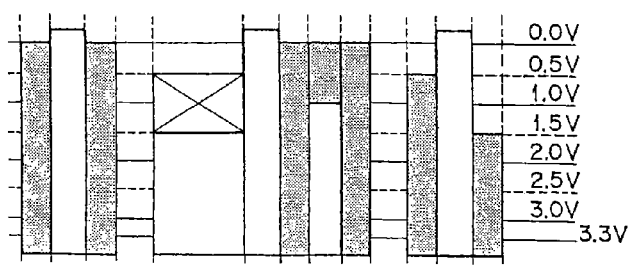

SOLID-STATE IMAGING ELEMENT HAVING IMAGE SIGNAL OVERFLOW PATH

CROSS REFERENCES TO RELATED APPLICATIONS

This is a Continuation application of U.S. patent application Ser. No. 13/067,112, filed May 10, 2011, which is a Continuation application of U.S. patent application Ser. No. 10/945,519, filed Sep. 20, 2004, now U.S. Pat. No. 8,031,248, which is a Continuation application of U.S. patent application Ser. No. 09/327,523, filed Jun. 8, 1999, now U.S. Pat. No. 7,116,365, which claims priority to Japanese Patent Application No.: 10-159050, filed Jun. 8, 1998, the entire contents of which are incorporated herein by reference.

BACKGROUND OF THE INVENTION

1. Field of the Invention

The present invention relates to a solid-state imaging element, a method for driving it, and a camera system, and particularly to an amplification type solid-state imaging element such as a CMOS image sensor having an amplification function for each of unit pixels arranged in a matrix form, a method for driving it, and a camera system using amplification type solid-state imaging elements as imaging devices.

2. Description of Related Art

Amplification type solid-state imaging elements, for example, CMOS image sensors have various pixel structures. As an example, there is known a pixel structure having floating diffusion (FD) inside pixels. This pixel structure is advantageous in that sensitivity can be increased because signals are amplified by the floating diffusion. FIG. 18 shows a prior art pixel structure of this type.

In FIG. 18, each of unit pixels 100 arranged in a matrix form includes photogate 101, transfer switch 102, floating diffusion 103, reset transistor 104, amplifying transistor 105, and vertical selection transistor 106. In response to a vertical selection pulse afforded via the vertical selection line 111, the vertical selection transistor 106 selects unit pixels 100 in units of rows, whereby a signal amplified by the amplifying transistor 105 is output to the vertical signal line 112.

By the way, to reduce pixel size requires that the number of elements to constitute a unit pixel 100 is reduced. However, since the pixel structure of a prior art CMOS image sensor described above dictates that three transistors, reset transistor 104, amplifying transistor 105, and vertical selection transistor 106, are used to select the potential of floating diffusion 103 in units of rows for output to vertical signal line 112, a large number of elements are used, hindering reduction of pixel size.

SUMMARY OF THE INVENTION

The present invention has been made in consideration of the above problem and an object of the present invention is to reduce the number of elements making up a unit pixel and offer a solid-state imaging element having made reduction of pixel size possible, a method for driving it, and a camera system.

A solid-state imaging element according to the present invention comprises:

unit pixels, arranged in a matrix form, which have photoelectric transfer elements, transfer switches for transferring charges stored in the photoelectric transfer elements, charge store parts for storing charges transferred by the transfer switches, reset switches for resetting the charge store parts, and amplifying elements for outputting signals in accordance with the potential of the charge store parts to vertical signal lines;

a vertical scanning circuit for selecting pixels in units of rows by controlling a reset potential afforded to the reset switch;

a horizontal scanning circuit for sequentially selecting signals output to the vertical signal lines in units of columns; and an output circuit for outputting signals selected by the horizontal scanning circuit via horizontal signal lines.

In a solid-state imaging element of the above configuration, by setting a reset potential afforded to a reset switch in a unit pixel to, e.g., 0 V at the time of other than pixel selection, the potential of a charge store part becomes Low. By affording, e.g., a pixel source voltage to the reset switch as a reset potential, pixels are selected, and upon the occurrence of a reset pulse, the potential of the charge store part is reset to the pixel source voltage. Namely, by controlling a reset potential, the potential of the charge store part is controlled. Subsequently, signal charges stored in the photoelectric transfer element are transferred to the charge store part and the potential of the charge store part that changes in accordance with the transfer is read into a vertical signal line by an amplifying element.

A method for driving a solid-state imaging element according to the present invention, in a solid-state imaging element comprising unit pixels, arranged in a matrix form, which have photoelectric transfer elements, transfer switches for transferring charges stored in the photoelectric transfer elements, charge store parts for storing charges transferred by the transfer switches, reset switches for resetting the charge store parts, and amplifying elements for outputting signals in accordance with the potential of the charge store parts to vertical signal lines, selects pixels in units of rows by controlling a reset potential afforded to the reset switches.

In a solid-state imaging element having an amplification function for each pixel, the potential of a charge store part is controlled by controlling a reset potential afforded to a reset switch to reset the charge store part. Thereby, pixels are selected in units of rows without providing an element for vertical (row) selection. That is, the reset switch also has a function to select pixels in unit of rows. Accordingly, an element for vertical selection can be cut from a unit pixel.

BRIEF DESCRIPTION OF THE DRAWINGS

FIGS. 4A to 4C show a potential diagram 1 of pixels of selection line in the first embodiment.

FIGS. 5A to 5C show a potential diagram 2 of pixels of selection line in the first embodiment.

FIGS. 6A to 6E are cross-sectional structure diagrams showing a concrete configuration example of overflow path.

FIG. 7 is a schematic configuration diagram showing a variant of the first embodiment of the present invention.

FIGS. 13A to 13D show a potential diagram 1 of pixels of selection line in the second embodiment.

FIGS. 14A to 14C show a potential diagram 2 of pixels of selection line in the second embodiment.

FIGS. 15A to 15D show a potential diagram 1 of pixels of non-selection line in the second embodiment.

FIGS. 16A to 16C show a potential diagram 2 of pixels of non-selection line in the second embodiment

DETAILED DESCRIPTION OF THE PREFERRED EMBODIMENTS

Hereinafter, embodiments of the present invention will be described with reference to the accompanying drawings.

Figure 1:
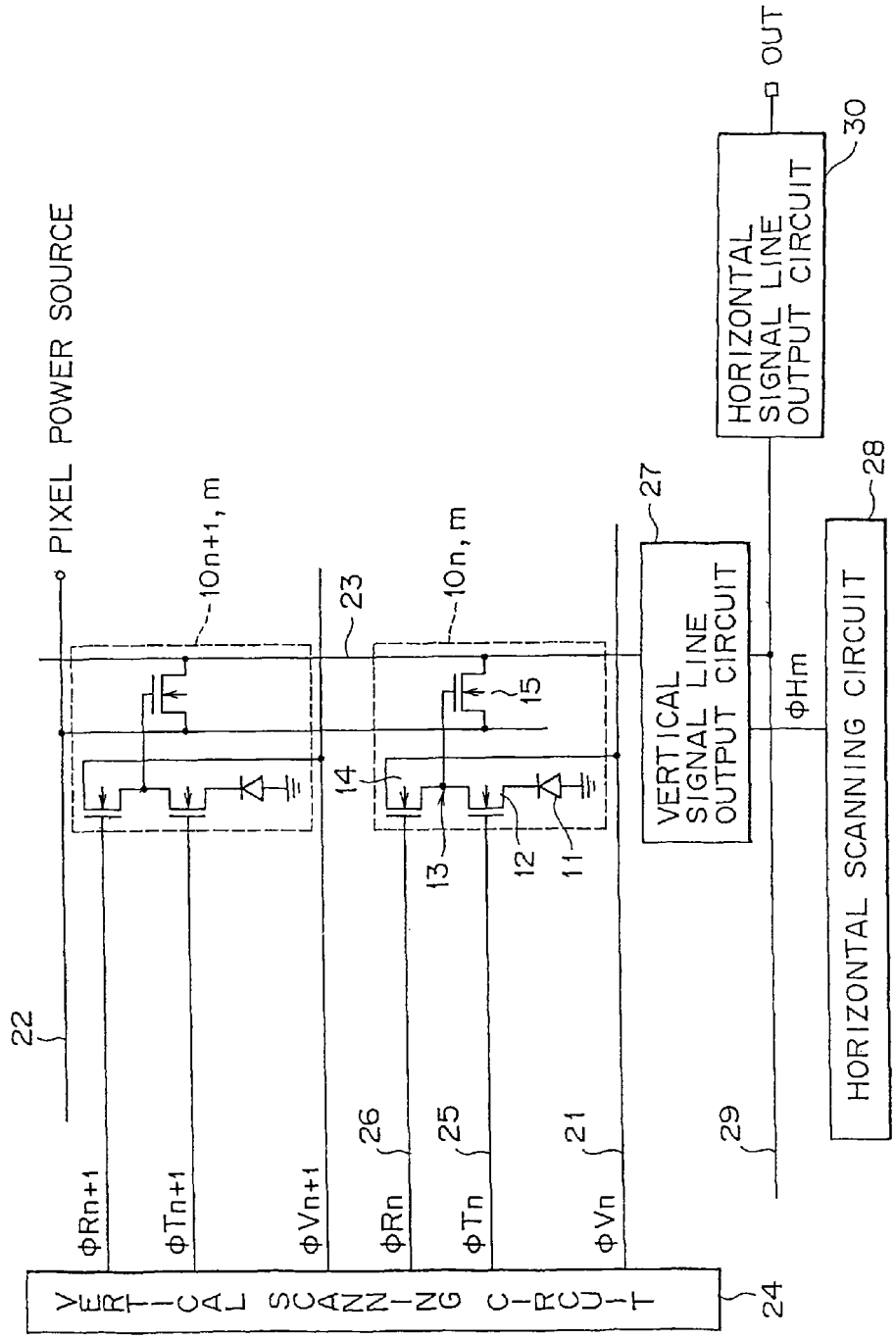
FIG. 1 is a schematic configuration diagram showing a first embodiment of the present invention.

FIG. 1 is a schematic configuration diagram of a CMOS image sensor according to a first embodiment of the present invention. In FIG. 1, unit pixels 10 are two-dimensionally arranged to constitute a pixel section; for simplicity, there are shown-here only two pixels, unit pixel $10n,m$ in the n-th row, the m-th column and unit pixel $10n+1,m$ in the (n+1)-th row, the m-th column. The structure of unit pixel 10 is the same for all pixels; hereinafter, as an example, the structure of unit pixel $10n,m$ in the n-th row, the m-th column will be described.

The unit pixel $10n,m$ comprises a photoelectric transfer element, e.g., photodiode 11, transfer switch 12, floating diffusion (FD) 13 serving as a charge store part, reset switch 14, and amplifying transistor 15. As a photoelectric transfer element, photogate or embedded photodiode can be substituted for the photodiode 11.

In this example, N-channel enhancement type transistor, N-channel depression type transistor, and N-channel enhancement type transistor are used as the transfer switch 12, reset switch 14, and amplifying transistor 15, respectively. However, all or part of these transistors can also be replaced by P-channel transistors to constitute the circuit.

In the unit pixel $10n,m$, the photodiode 11 is a p-n junction diode that photoelectrically converts incident light into signal charge of quantity in accordance with the quantity of the incident light and stores it. The transfer switch 12, connected between the photodiode 11 and floating diffusion 13, transfers the signal charge stored in the photodiode 11 to the floating diffusion 13. The floating diffusion 13 converts the transferred signal charge into a signal voltage and affords the voltage to the gate of the amplifying transistor 15.

The reset switch 14, connected between the floating diffusion 13 and vertical selection line 21, has a function to reset the potential of the floating diffusion 13 to that of pixel power source. The amplifying transistor 15, connected between power source line 22 and vertical signal line 23, amplifies the potential of the floating diffusion 13 and outputs the amplified potential to the vertical signal line 23. A pixel power source voltage is not limited to 3.3V, which is used as an example in this example.

Figure 2:
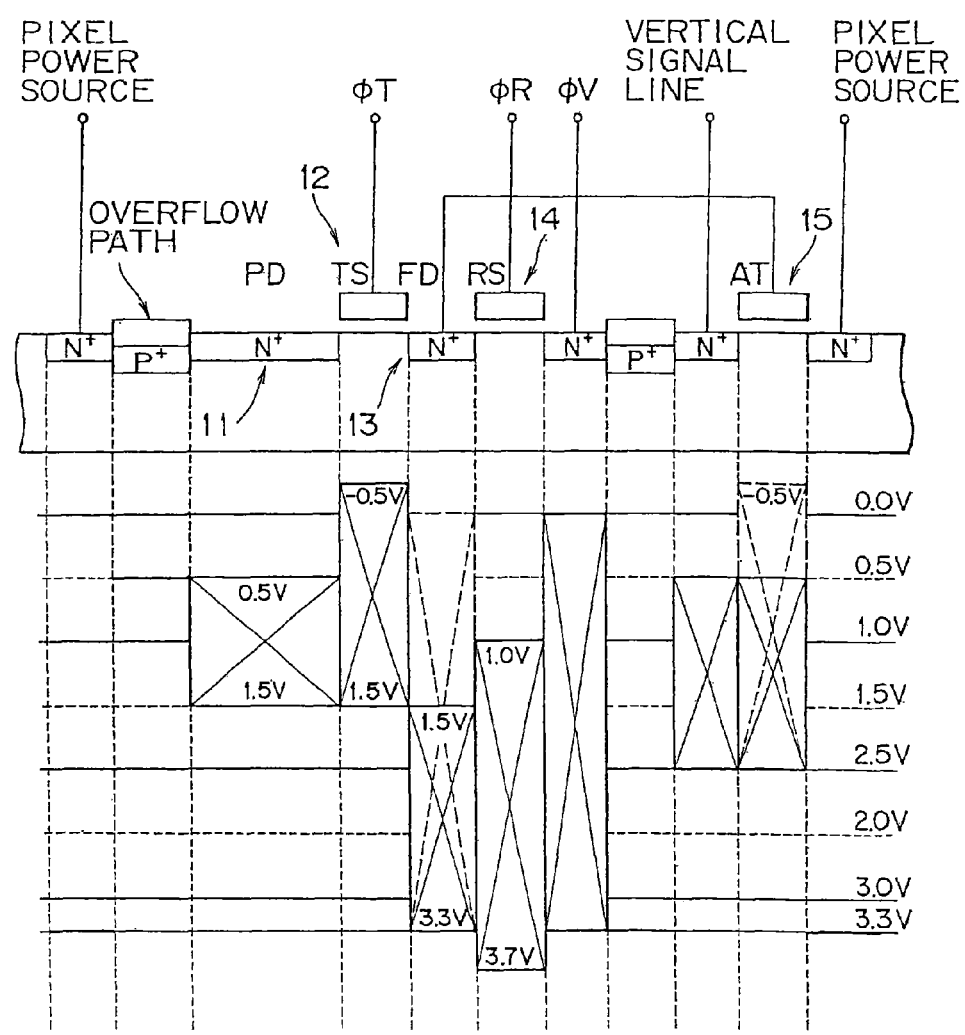
FIG. 2 is a potential diagram of unit pixel and vertical signal line in the first embodiment.

FIG. 2 shows a potential distribution of unit pixel 10 and vertical signal line 23 in the first embodiment. In the figure, PD, TS, FD, RS, and AT designate photodiode 11, transfer switch 12, floating diffusion 13, reset switch 14, and amplifying transistor 15, respectively. For potentials of the floating diffusion 13 and amplifying transistor 15, a potential operation range at selection and a potential operation range at other times are shown by solid lines and dashed lines, respectively.

Vertical scanning circuit 24, provided to select unit pixels 10 in units of rows, is comprised of e.g., a shift register. From the vertical scanning circuit 24, vertical selection pulse φV ( . . . , φVn, φVn+1, . . . ), transfer pulse φT ( . . . , φTn, φTn+1, . . . ), and reset pulse φR ( . . . , φRn, φRn+1, . . . ) are output.

The vertical selection pulse φV ( . . . , φVn, φVn+1, . . . ) is applied to the drain of reset switch 14 through the vertical selection line 21, the transfer pulse φT ( . . . , φTn, φTn+1, . . . ) to the gate transfer switch 12 through the transfer line 25, and the reset pulse φR ( . . . , φRn, φRn+1, . . . ) to the gate of reset switch 14 through the reset line 26.

To the end of vertical signal line 23, vertical signal line output circuit 27 is connected for each column. As the vertical signal line output circuit 27, an output circuit of e.g., voltage mode type is used. Horizontal selection pulse φH ( . . . , φHm, . . . ) from horizontal scanning circuit 28 is fed to the vertical signal line output circuit 27. The horizontal scanning circuit 28, provided to select unit pixels 10 in units of columns, is comprised of e.g., a shift register.

The output end of vertical signal line output circuit 27 is connected to horizontal signal line 29. To the horizontal signal line 29, one line of signals read into the vertical signal line output circuit 27 through the vertical signal line 23 from unit pixel 10 is output sequentially from the vertical signal line output circuit 27 by horizontal scanning of the horizontal scanning circuit 28. The input end of horizontal signal line output circuit 30 is connected to the end of horizontal signal line 29.

Figure 3:
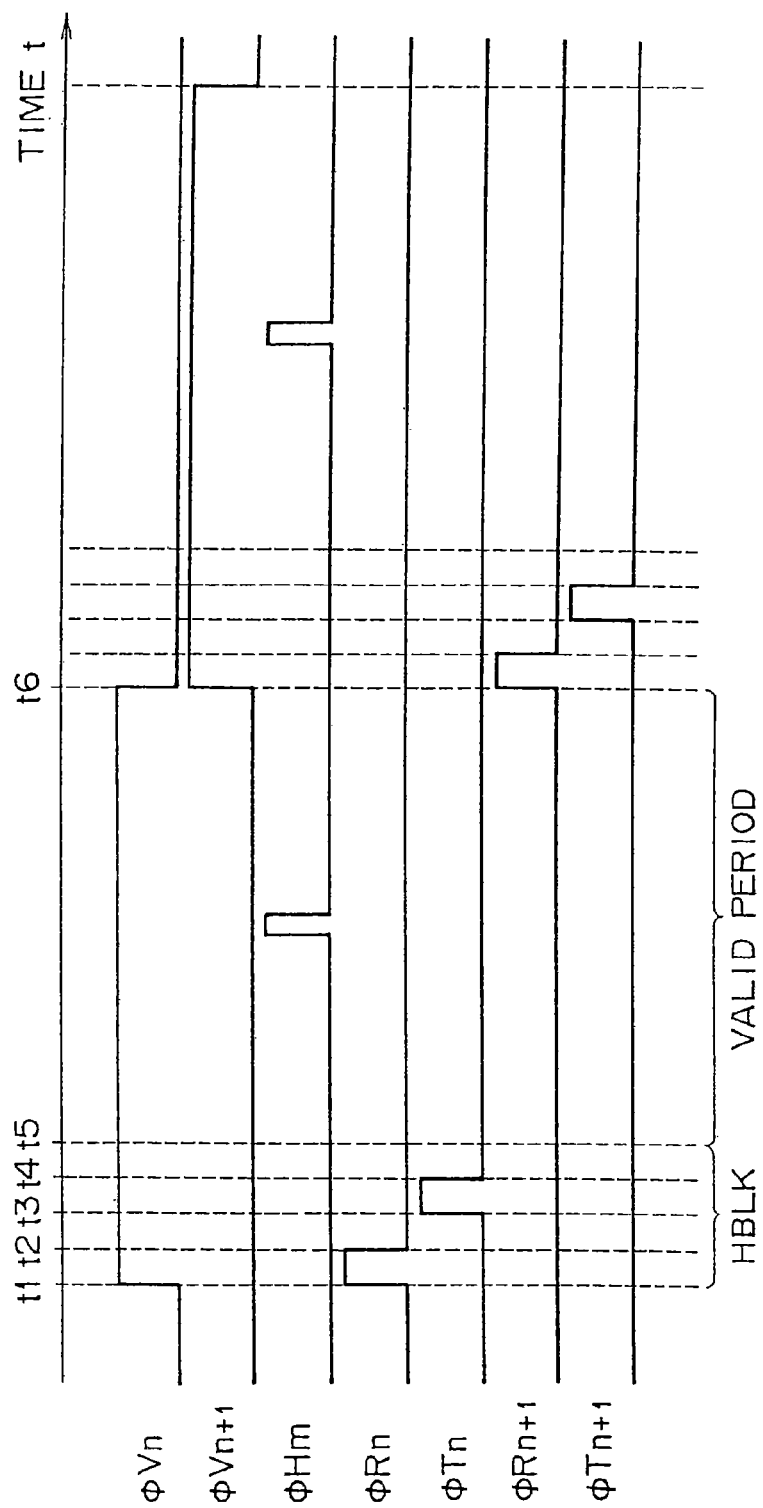
FIG. 3 is a timing chart at pixel selection in the first embodiment.

Next, the pixel operation in a CMOS image sensor according to the first embodiment of the above configuration will be described using an example of selecting pixels of n-th line (n-th row). Herein, the timing chart of FIG. 3 will be used with reference to the potential diagrams of FIGS. 4 and 5.

A time period (t<t1) until time t1 is non-selection state. In the non-selection state, since vertical selection pulse φVn is in Low level (0 V) and reset switch (RS) 14 is in off state, the potential of floating diffusion (FD) 13 is 0 V.

At time t1, the vertical selection pulse φVn changes from Low to High (3.3V), and at the same time, in response to the occurrence of reset pulse φRn, the reset switch 14 goes on and the potential of floating diffusion 13 of the n-th line is reset from 0 V to 3.3V. As a result, since the amplifying transistor (AT) 15 is turned on, pixels of the n-th line go into selection state (t1<t<t2).

Upon the extinction of the reset pulse φRn at time t2, the reset floating diffusion 13 is read. Consequently, an offset level (hereinafter, called a noise level) different for each different pixel is read into the vertical signal line 23 by the amplifying transistor 15 and output to the vertical signal line output circuit 27 (t2<t<t3). The read-out noise level is held (sample held) within the vertical signal line output circuit 27.

Upon the occurrence of transfer pulse φTn at time t3, the transfer switch (TS) 12, because a potential below the gate thereof is deepened by the transfer pulse φTn applied to the gate, transfers signal charge stored in the photodiode (PD) 11 to the floating diffusion 13 (t3<t<t4). The transfer of signal charge causes the potential of the floating diffusion 13 to change in accordance with the quantity of charge.

Upon the extinction of the transfer pulse φTn at time t4, a potential in accordance with the signal charge of the floating diffusion 13 is read into the vertical signal line 23 by the amplifying transistor 15 and output to the vertical signal line output-circuit (t4<t<t5). The read-out signal level is held (sample held) within the vertical signal line output circuit 27.

Upon entry to a horizontal valid period, signals read from pixels 10 into the vertical signal line output circuit 27 for each column are sequentially output to the horizontal signal line output circuit 30 through the horizontal signal line 29. At this time, in these output circuits 27 and 30, by subtracting a noise level from the signal level of unit pixel 10, a fixed pattern noise due to the dispersion of characteristics of unit pixel 10 is suppressed and a fixed pattern noise due to the dispersion of characteristics of the vertical signal line output circuit 27 is suppressed.

At time t6, the vertical selection pulse φVn changes from High to Low, and thereby pixels on the n-th line go into non-selection state, and at the same time, pixels on the next (n+1)-th line go into selection state, and the above operation is repeated on the (n+1)-th line.

Herein, a description will be made of pixels on non-selection lines. By driving the vertical selection pulse φV (0 V), pixel 10 can be put in non-selection state. This is because since a depression type transistor is used as the reset switch 14, when the vertical selection pulse φV is 0 V, the floating diffusion 13 is always 0 V, and thereby the amplifying transistor 15 is always in cut-off state.

As described above, unit pixel 10 is comprised of photodiode 11, transfer switch 12, floating diffusion 13, reset switch 14, and amplifying transistor 15, and the potential of floating diffusion 13 is controlled through the reset switch 14, whereby one transistor can be cut because a vertical selection switch is not provided to provide the vertical selection function, as it would be in the case of conventional pixel structures.

When the vertical selection pulse φV is driven Low by incorporating a charge pump circuit, the gate of the transfer switch 12 can be put at a negative potential for a long period other than the period t3<t<t4. In such a case, a dark current can be suppressed since holes can be implanted into the silicon interface of the transfer switch adjacent to the photodiode 11 for a long period of time. This produces a great effect, particularly when an embedded sensor structure is employed as the photodiode 11.

Although the foregoing description of operation, for simplicity, has been on all pixel independent reading mode in which signals of pixels of all lines are independently read, the present invention is not limited to that mode. Of course, frame reading mode and field reading mode are also possible. In the former mode, signals of odd (even) lines are read in a first field and signals of even (odd) lines are read in a second field. In the latter mode, signals of two adjacent lines are read at the same time to add voltages, and combinations of two lines for the addition operation are changed on a field basis.

Herein, a description will be made of a concrete configuration of unit pixel 10. When signal charges are stored in the photodiode 11, as apparent from FIG. 4A, the floating diffusion 13 becomes 0 V. For this reason, during the charge storing, the surface potential of the transfer switch 12 must be 0 or less. However, without a special process, there would be no path for discharging charges that overflow from the photodiode 11.

Accordingly, a pixel structure according to the present invention is made so that a diffusion layer connected to power source, e.g., the drain of the amplifying transistor 15 is laid out adjacently to the photodiode 11 and element separation between both is made imperfect, whereby an overflow path is formed and excess charges are discharged (overflowed) via the path. By this process, an overflow path can be formed without increasing the dimension of unit pixel 10.

As concrete examples of forming an overflow path, various structures described below are possible. As shown in FIGS. 6A to 6E, there are a structure (FIG. 6A) in which an overflow path is formed by reducing the width (distance) of an element separation region; a structure (FIG. 6B) in which an overflow path is formed by reducing the density of a P region for channel stop; and a structure (FIG. 6C) in which an overflow path is formed by positively forming an $N^-$ region below a P region for channel stop.

In the case where an embedded sensor structure is used as the photodiode 11, there are a structure (FIG. 6D) in which an $N^+$ (SR $N^+$) region for sensor is formed also in the pixel power source side to moderately form a lateral distance of an overflow path and further a high-density impurity is injected into the $N^+$ region of the pixel power source side to form a $N^+$ region for source/drain; and a structure (FIG. 6E) in which an $N^-$ region is formed for an overflow path in the (FIG. 6D) structure.

A LOCOS (Local Oxidation of Silicon) oxide film shown in-each of the structures of FIGS. 6A to 6C is not necessarily necessary. However, in this case, to moderately form a lateral distance of an overflow path, as in the example of the (FIG. 6D) structure, it is desirable to implant ions to an $N^+$ region of photodiode 11 and an $N^+$ region of pixel power source adjacent to an overflow pulse with an identical mask.

As in each of the structures of FIG. 6A, and FIGS. 6C to 6E, the silicon interface of overflow section is not depleted by forming the overflow path with a virtual gate. Accordingly, dark current occurs less frequently, compared with prior art overflow structures in which a transfer gate is used, in which case a silicon interface would be depleted. A greater effect is obtained particularly when an embedded sensor structure is used as the photodiode 11, because depleted portions of silicon interface can be completely eliminated.

FIG. 7 is a schematic configuration diagram of a variant of a first embodiment of the present invention. The first embodiment takes a configuration in which signals from pixels are output in voltage mode, while the variant takes a configuration in which signals from pixels are output in current mode. Accordingly, the pixel structure of unit pixel is exactly the same as that of the first embodiment, except for the configuration of a signal output system.

A CMOS image sensor according to the variant takes a configuration in which horizontal selection switch 31 is connected between the end of vertical signal line 23 and horizontal signal line 29, and an operational amplifier 33 fed back by resistor 32 is placed at the end of horizontal signal line 29. That is, to output signals from pixels in current mode, the vertical signal line 23 and horizontal signal line 29 are fixed to a constant potential (Vbias) by the operational amplifier 33 fed back by the resistor 32 and the amplifying transistor 15 within unit pixel $10n,m$ is linearly operated by incorporating a power source circuit 34, for example, and reducing a source voltage to be afforded to pixels.

Although this variant is constructed in a way that incorporates the power source circuit 34 and reduces a source voltage to be afforded to pixels, the present invention is not limited to this construction. For example, by reducing a threshold voltage Vth of the amplifying transistor 15 within unit pixel $10n,m$, the amplifying transistor 15 can also be linearly operated.

Figure 8:
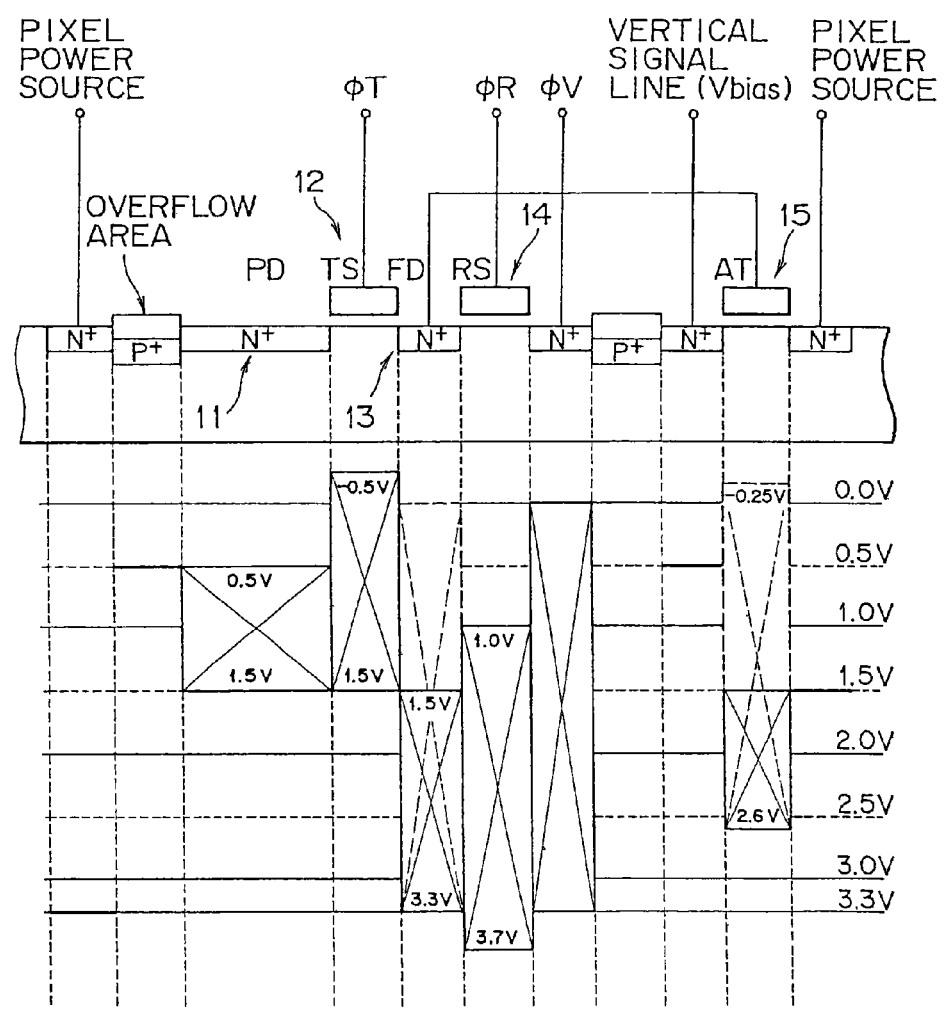
FIG. 8 is a potential diagram of unit pixel and vertical signal line in of a variant of the first embodiment.

FIG. 8 shows a potential distribution of unit pixel 10 and vertical signal line 23 in this variant. In FIG. 8, PD, TS, FD, RS, and AT designate photodiode 11, transfer switch 12, floating diffusion 13, reset switch 14, and amplifying transistor 15, respectively. For potentials of the floating diffusion 13 and amplifying transistor 15, a potential operation range at selection and a potential operation range at other times are shown by solid lines and dashed lines, respectively.

Figure 9:
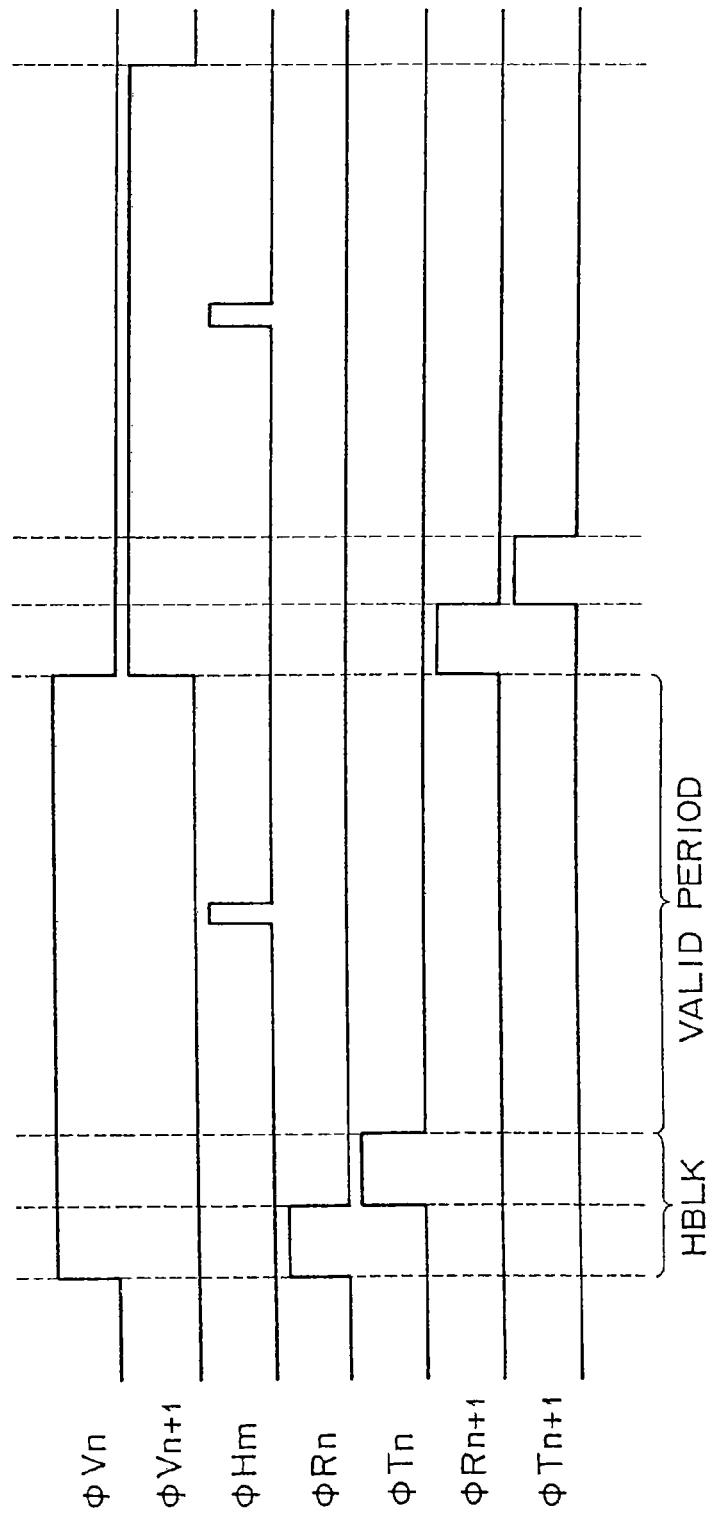
FIG. 9 is a timing chart at pixel selection in a variant of the first embodiment.

FIG. 9 is a timing chart for explaining the operation of a CMOS image sensor according to this variant. Fundamental portions of the operation of unit pixel 10n,m are the same as those of the first embodiment. Herein, to avoid an overlapping description, only different portions will be described.

Signals are read from pixels during a horizontal valid period. Noise levels are not read but only signal levels are read. Since a sample hold operation cannot be performed in a signal output system in the current mode as it could be in the voltage mode, fixed pattern noises of signal levels due to the characteristics of pixels are suppressed using a frame memory in an external signal processing system.

Although FIG. 9 is a timing chart on the all pixel independent reading mode in which signals of pixels of all lines are independently read, the present invention is not limited to that mode. Of course, the frame reading mode and the field reading mode are also possible. In the former mode, signals of odd (even) lines are read in a first field and signals of even (odd) lines are read in a second field. In the latter mode, signals of two adjacent lines are read at the same time to add currents, and combinations of two lines for the addition operation are changed on a field basis.

Figure 10:
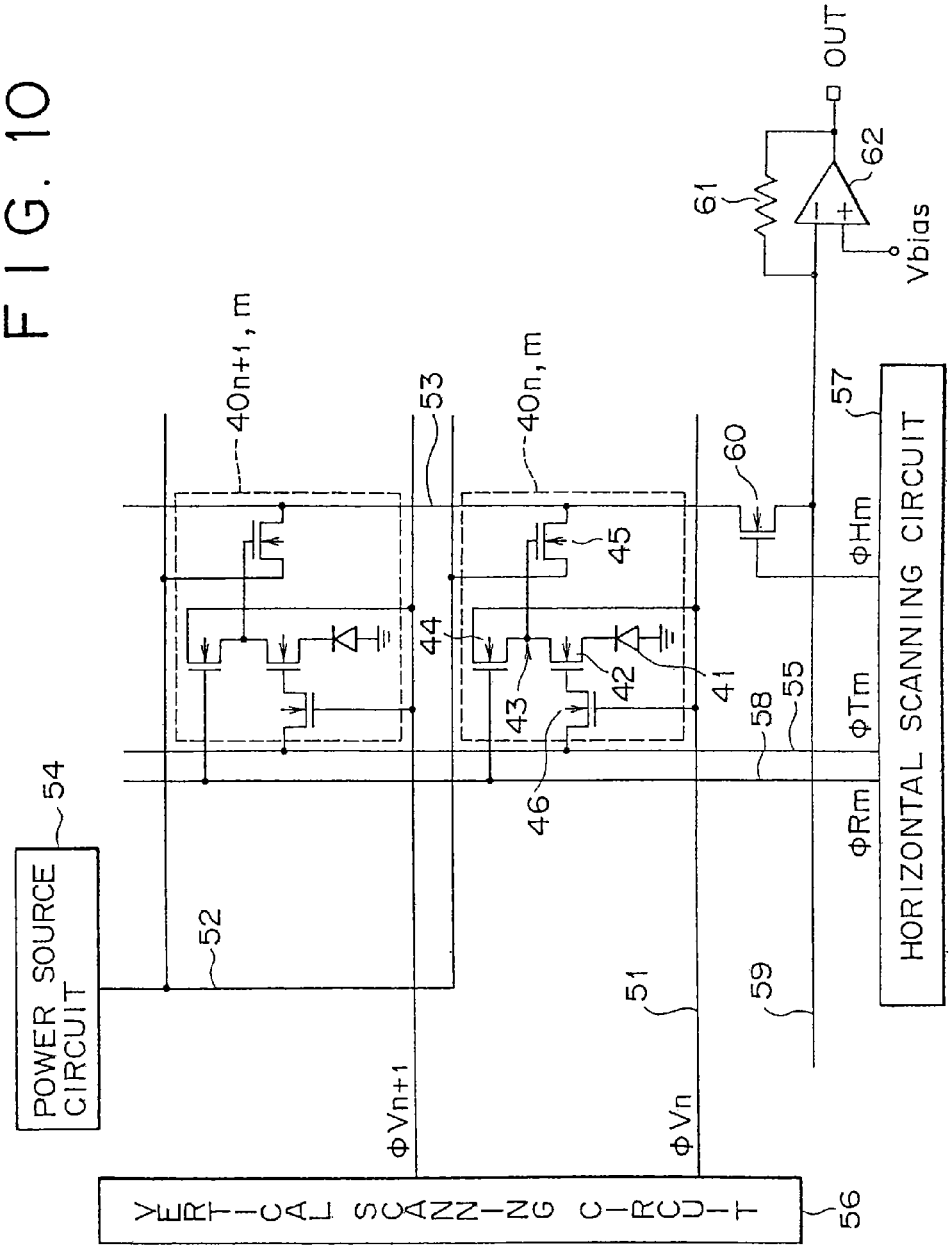
FIG. 10 is a schematic configuration diagram showing a second embodiment of the present invention.

FIG. 10 is a schematic configuration diagram of a CMOS image sensor according to a second embodiment of the present invention. In FIG. 10, unit pixels 40 are two-dimensionally arranged to constitute a pixel section; for simplicity, there are shown here only two pixels, unit pixel 40n,m in the n-th row, the m-th column and unit pixel 40n+1,m in the (n+1)-th row, the m-th column. The structure of unit pixel 40 is the same for all pixels; hereinafter, as an example, the structure of unit pixel 40n,m in the n-th row, the m-th column will be described.

The unit pixel 40n,m comprises a photoelectric transfer element, e.g., photodiode 41, transfer switch 42, floating diffusion (FD) 43 serving as a charge store part, reset switch 44, amplifying transistor 45, and transfer selection switch 46. As a photoelectric transfer element, photogate or embedded photodiode can be substituted for the photodiode 41.

In this example, N-channel enhancement type transistor, N-channel depression type transistor, N-channel enhancement type transistor, and N-channel enhancement type transistor are used as transfer switch 42, reset switch 44, amplifying transistor 45, and transfer selection switch 45, respectively. However, all or part of these transistors can also be replaced by P-channel transistors to constitute the circuit.

In the unit pixel 40n,m, the photodiode 41 is a p-n junction diode of e.g., an embedded sensor structure that photoelectrically converts incident light into signal charge of quantity in accordance with the quantity of the incident light and stores it. The transfer switch 42, connected between the photodiode 41 and floating diffusion 43, transfers the signal charge stored in the photodiode 41 to the floating diffusion 43. The floating diffusion 43 converts the transferred signal charge into a signal voltage and feeds the voltage to the gate of the amplifying transistor 45.

The reset switch 44, connected between the floating diffusion 43 and vertical selection line 51, has a function to reset the potential of the floating diffusion 43 to that of pixel power source. The amplifying transistor 45, connected between power source line 52 and vertical signal line 53, amplifies the potential of the floating diffusion 43 and outputs the amplified potential to the vertical signal line 53.

To the power source line 52, a voltage of e.g., 3.3 V is afforded from power source circuit 54. However, a source voltage is not limited to 3.3 V. Transfer selection switch 46, connected between transfer line 55 and transfer switch 42, performs transfer control for the transfer switch 42.

Figure 11:
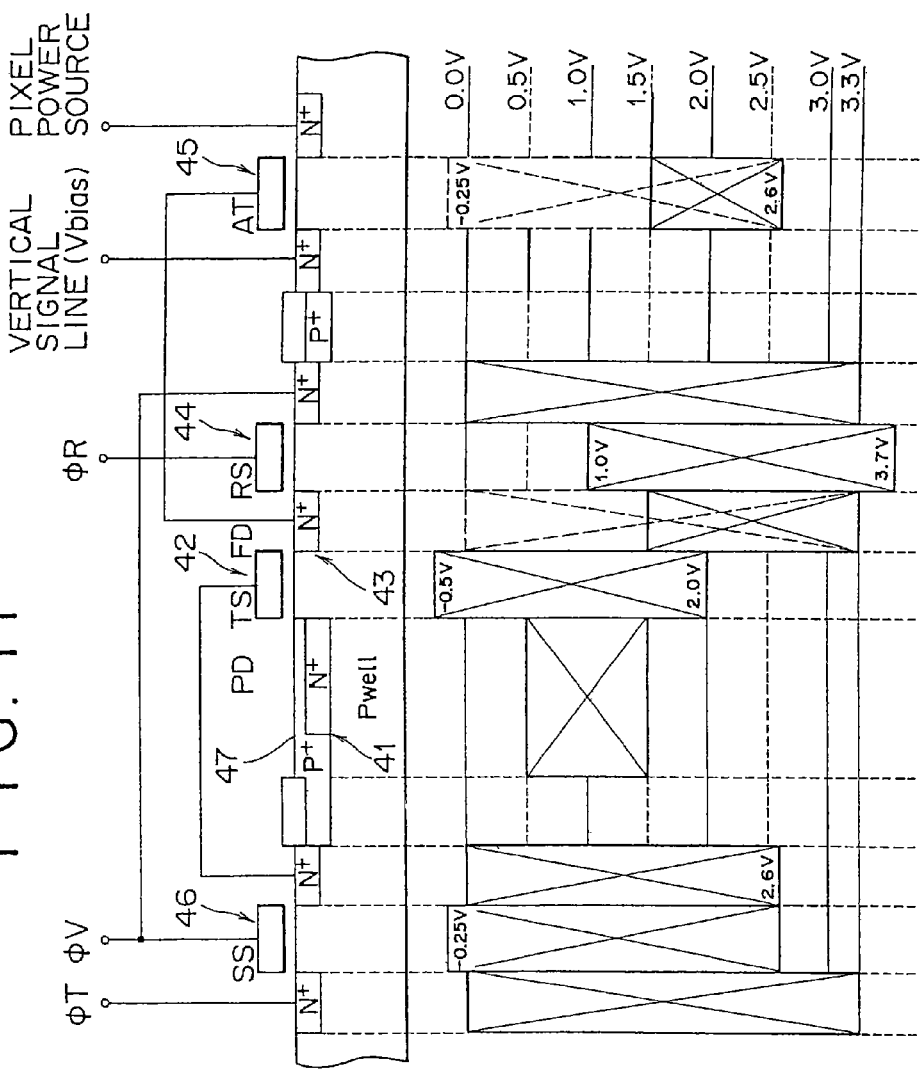
FIG. 11 is a potential diagram of unit pixel and vertical signal line in the second embodiment.

FIG. 11 shows a potential distribution of unit pixel 40 and vertical signal line 53 in the second embodiment. In FIG. 11, PD, TS, FD, RS, AT, and SS designate photodiode 41, transfer switch 42, floating diffusion 43, reset switch 44, amplifying transistor 45, and transfer selection switch 46, respectively. For potentials of the floating diffusion 43 and amplifying transistor 45, a potential operation range at selection and a potential operation range at other times are shown by solid lines and dashed lines, respectively.

As apparent from FIG. 11, in this example, a photodiode of an embedded sensor structure is used as photodiode 41. That is, the photodiode is of such a sensor construction that $P^+$ hole store layer 47 is provided on the substrate surface of the p-n junction diode. For an overflow path of unit pixel 40, the pixel structures in FIGS. 6A to 6E are employed, as in the first embodiment.

Vertical scanning circuit 56, provided to select unit pixels 40 in units of rows, is comprised of e.g., a shift register. From the vertical scanning circuit 56, vertical selection pulse φV ( . . . , φVn, φVn+1, . . . ) is output. Vertical selection pulse φV ( . . . , φVn, φVn+1, . . . ) is applied to the drain of reset switch 14 via the vertical selection line 51.

Vertical scanning circuit 57, provided to select unit pixels 40 in units of columns, is comprised of e.g., a shift register. From the horizontal scanning circuit 57, reset pulse φR ( . . . , φRm, . . . ), transfer pulse φT ( . . . , φTm, . . . ), and horizontal selection pulse φH ( . . . , φHm, . . . ) are output. The transfer pulse φT ( . . . , φTm, . . . ) is applied to the drain of transfer selection switch 46 via the transfer line 55, and the reset pulse φR ( . . . , φRm, . . . ) to the gate of reset switch 44 via the reset line 58.

Horizontal selection switch 60 is connected between the end of vertical signal line 53 and horizontal signal line 59. As the horizontal selection transistor 60, an N-channel transistor, for example, is used. Horizontal selection pulse φH ( . . . , φHm, . . . ) output from horizontal scanning circuit 57 is fed to the gate of the horizontal selection transistor 60. An operational amplifier 62 fed back by resistor 61 is placed at the end of horizontal signal line 59.

A CMOS image sensor according to the second embodiment of the above configuration takes a configuration in which signals from pixels are output in the current mode. That is, the vertical signal line 53 and horizontal signal line 59 are fixed to a constant potential (Vbias) by the operational amplifier 62 fed back by the resistor 61 and the amplifying transistor 45 within unit pixel 40n,m is linearly operated by incorporating a power source circuit 54 and reducing a source voltage to be afforded to pixels.

Although this embodiment is configured so that the amplifying transistor 45 is linearly operated by incorporating the power source circuit 54 and reducing a source voltage to be afforded to pixels, the present invention is not limited to this configuration. For example, by reducing a threshold voltage Vth of the amplifying transistor 45 within unit pixel 40n,m, the amplifying transistor 45 can be linearly operated.

Figure 12:
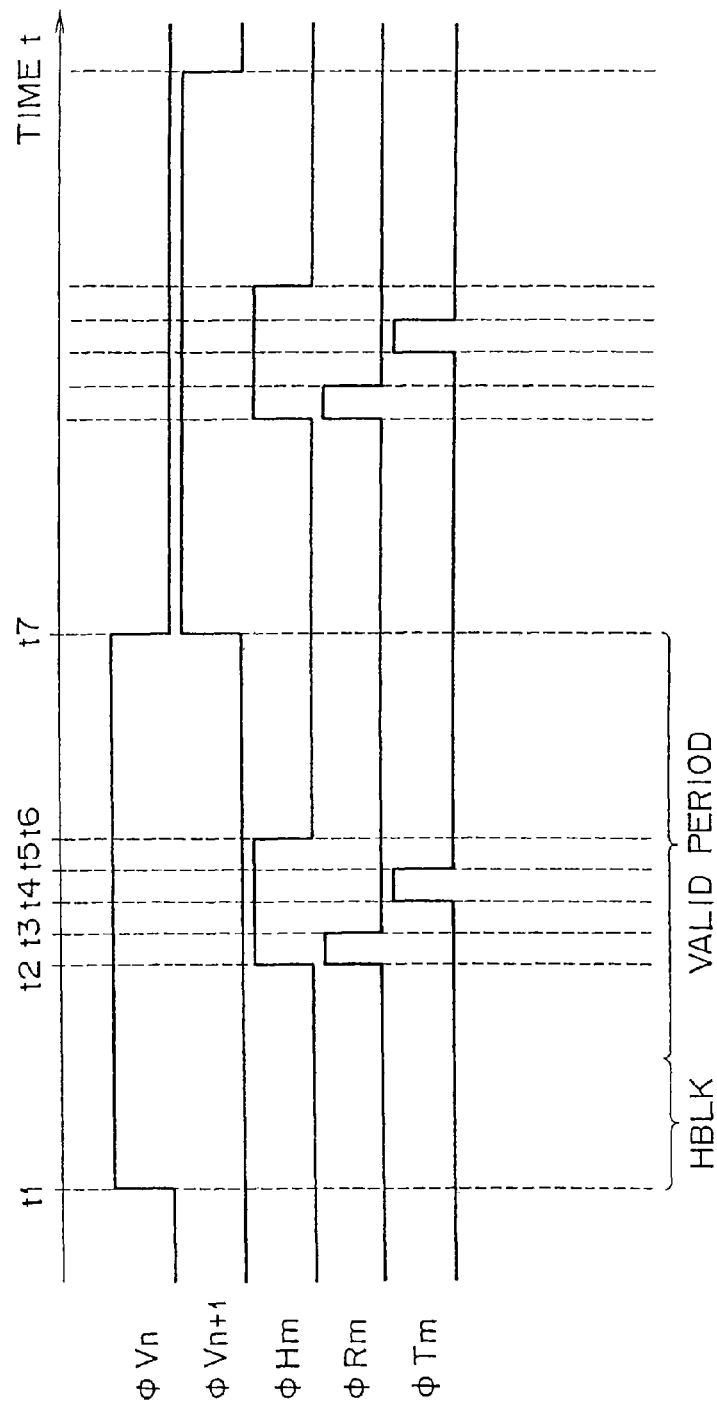
FIG. 12 is a timing chart at pixel selection in the second embodiment.

Next, the pixel operation in a CMOS image sensor according to the second embodiment of the above configuration will be described using an example of selecting pixels of, n-th line. Herein, the timing chart of FIG. 12 will be used with reference to the potential diagrams of FIGS. 13 and 14.

A time period (t<t1) until time t1 is non-selection state. In the non-selection state, since vertical selection pulse φVn is in Low level (0 V) and reset switch (RS) 44 is in off state, the potential of floating diffusion (FD) 43 is 0 V.

At time t1, the vertical selection pulse φVn changes from Low to High (3.3V). The gate potential of the amplifying transistor (AT) 45 increases because a depression type transistor is used as the reset transistor 44 (t1<t<t2).

At this time, the amplifying transistor 45 may comes on depending on the potential setting thereof or the potential of the vertical signal line 53. This example assumes that the amplifying transistor 45 is cut off. At this point, however, since the horizontal selection switch 60 is off and no influence is exerted on the horizontal signal line 59, it does not matter in which state the amplifying transistor 45 is.

In response to the occurrence of reset pulse φRm at time t2, the reset switch 44 comes on and the potential of floating diffusion 43 in the n-th line, the m-th column is reset from 0 V to 3.3 V. Since this results in the amplifying transistor (AT) 45 turning on, unit pixel 40$n,m$ in the n-th line, the m-th column goes into the selection state (t2<t<t3).

Upon the extinction of the reset pulse φRm at time t3, the reset floating diffusion 43 is read. Consequently, an offset level (hereinafter, called a noise level) different for each pixel is read into the vertical signal line 53 (t3<t<t4). The read-out noise level is, in response to the horizontal selection pulse φHm that occurred at time t2, output to the horizontal signal line 59 by the horizontal selection switch 60 that is on.

Upon the occurrence of transfer pulse φTm at time t4, the transfer switch (TS) 42, because a potential below the gate thereof is deepened by the transfer pulse φTn applied to the gate, transfers signal charge stored in the photodiode (PD) 41 to the floating diffusion 43 (t4<t<t5). The transfer of the signal charge causes the potential of the floating diffusion 43 to change in accordance with the quantity of charge.

Upon the extinction of the transfer pulse φTm at time t5, a potential in accordance with the signal charge of the floating diffusion 43 is read into the vertical signal line 53 by the amplifying transistor 45 (t5<t<t6). The read-out noise level is output to the horizontal signal line 59 by the horizontal selection switch 60.

At time t7, the vertical selection pulse φVn changes from High to Low, whereby pixels on the n-th line go into non-selection state, and at the same time, pixels on the next (n+1)-th line go into selection state, and the above operation is repeated on the (n+1)-th line.

As described above, for one pixel, noise level and signal level are sequentially obtained in that order (a reverse order from signal level to noise level is also permissible). This operation is called a pixel point sequential reset operation.

The pixel point sequential reset operation has the following advantages:

① Since noise output and signal output take an identical path including the horizontal selection switch 60, a fixed pattern noise due to dispersion between paths will not occur in principle.

② Since noise level and signal level are sequentially output, the difference between noise level and signal level can be obtained by a differential circuit such as a correlated duplex sampling circuit (CDS circuit) without using frame memory and line memory in an external signal processing system, so that the system can be simplified.

A series of pixel point sequential reset operations described above must be performed at a high speed. For this reason, signals from pixels are output in the current mode that is advantageous in terms of operation speed. However, without being limited to a mode of current mode output, if speed requirements are satisfied, a mode of voltage mode output can also be taken, as in a CMOS image sensor according to the first embodiment.

As apparent from the potential diagrams of FIGS. 15 and 16, the operation of pixels not selected does not matter particularly even if transfer pulse φTm and reset pulse φRm are shared in column direction.

Although the foregoing description of operation, for simplicity, is on the all pixel independent reading mode in which signals of pixels of all lines are independently read, the present invention is not limited to that mode. Of course, frame reading mode and field reading mode are also possible. In the former mode, signals of odd (even) lines are read in a first field and signals of even (odd) lines are read in a second field. In the latter mode, signals of two adjacent lines are read at the same time to add currents, and combinations of two lines for the addition operation are changed on a field basis.

In the CMOS image sensor according to the above second embodiment, adjacent φTm−1 and reset pulse φRm can be also be shared, and thereby the wiring can be cut.

By positively providing capacity to a node connected to the gate of transfer selection switch 46 and the gate of transfer switch 42, when vertical selection pulse φVn changes from High to Low when t>t7, the gate potential of the transfer switch 42 can be made negative. By this arrangement, since holes can be implanted into the silicon interface of transfer switch 42 adjacent to the photodiode 41, a dark current can be suppressed.

Furthermore, the power source circuit 54 can be cut by shifting (in this example, e.g., 1.5 V shift) the potential (Vbias) of vertical signal line 53, the potential of amplifying transistor 45, and the entire source voltage.

A variant of the second embodiment can be constructed so that current output is performed by transferring the role of the amplifying transistor 45 as source follower resistance load to the horizontal selection switch 60. That is, a current output operation is performed as described below.

Assume that the horizontal selection switch 60 operates in a linear area. The potential of horizontal signal line 59 is held constant, for example, by using an operational amplifier 33 fed back by a resistor. By doing so, a source follower loaded with a resistor is formed by the amplifying transistor 46 and the horizontal selection switch 60, a current flows through the horizontal signal line 59 in accordance with the potential of floating diffusion 43, and a voltage in accordance with the potential of floating diffusion 43 develops at the output end of the operational amplifier.

Figure 17:
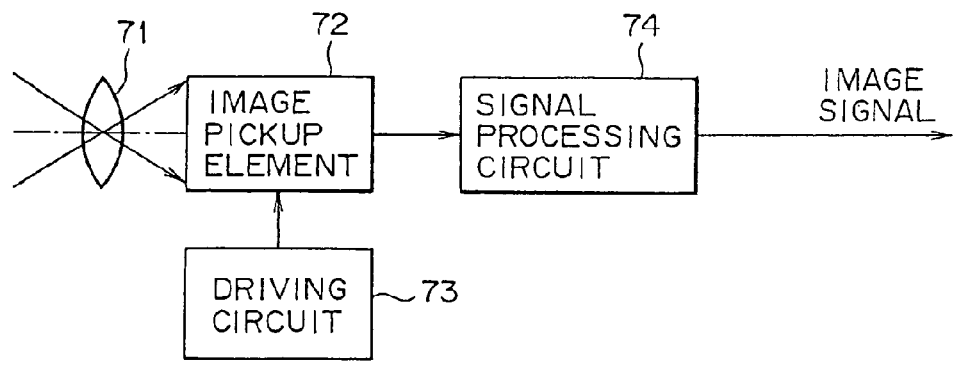
FIG. 17 is a schematic configuration diagram of an example of a camera system to which the present invention is applied.
Figure 18:
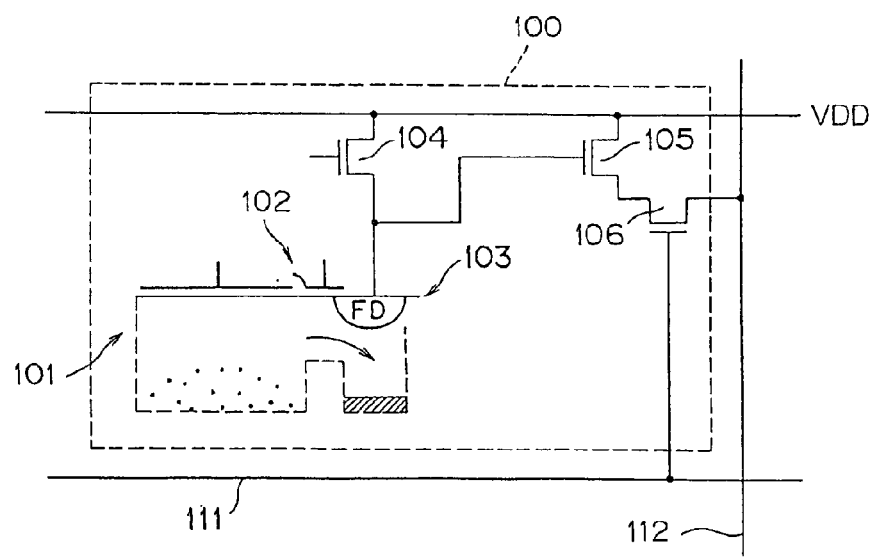
FIG. 18 is a circuit diagram showing the configuration of a prior art unit pixel.

FIG. 17 is a schematic configuration diagram of an example of a camera system to which the present invention is applied. In FIG. 17, incident light (image light) from an object (not shown) forms an image on the imaging surface of imaging element 72 by an optical system including lens 71 and other elements. As the imaging element 72, a CMOS image sensor according to the foregoing first embodiment or variant thereof, or the second embodiment is used.

The imaging element 72 is driven based on a variety of timings output from driving circuit 73 including a timing generator and the like. An imaging signal output from the imaging element 72 is subjected to various signal operations in signal processing circuit 74 before being output as an image signal.

As described above, according to the present invention, unit pixels arranged in a matrix form are comprised of a photoelectric transfer element, transfer switch, a charge store part, a reset switch, and an amplifying element, and pixels are selected in units of rows by controlling a reset potential afforded to the reset switch, whereby an element for vertical selection can be cut, making reduction of pixel size possible.

What is claimed is:

1. A solid state imaging device comprising:
   a pixel including a photoelectric conversion element;
   a transfer switch associated with the photoelectric conversion element and a charge store element;
   an amplifying element associated with the charge store element and a vertical line;
   a reset switch associated with the charge store element, a drain of the reset switch being configured to receive a plurality of voltages from a selection line,
   wherein the plurality of voltages includes a first voltage and a second voltage, the first voltage being selected during a first situation and the second voltage being selected during a second situation.

2. The solid state imaging device according to claim 1, wherein:
   the first situation is based on the pixel correspond to a selection state;
   the second situation is based on the pixel correspond a non-selection state.

3. The solid state imaging device according to claim 1, wherein the charge store part is a floating diffusion region.

4. The solid state imaging device according to claim 1, wherein the reset switch is configured to reset the charge store element.

5. The solid state imaging device according to claim 1, wherein a gate of the amplifying switch is electrically connected to the charge store element.

6. The solid state imaging device according to claim 1, wherein a gate of the reset switch is electrically connected to a reset line.

7. The solid state imaging device according to claim 1, wherein the transfer switch is configured to transfer a signal charge from the photoelectric conversion element to the charge store element.

8. The solid state imaging device according to claim 7, the photoelectric conversion element is configured to convert incident light into the signal charge.

9. An electronic apparatus comprising:
   a solid state imaging device, said solid state imaging device comprising:
      a pixel including a photoelectric conversion element;
      a transfer switch associated with the photoelectric conversion element and a charge store element;
      an amplifying element associated with the charge store element and a vertical line;
      a reset switch associated with the charge store element, a drain of the reset switch being configured to receive a plurality of voltages from a selection line,
      wherein the plurality of voltages includes a first voltage and a second voltage, the first voltage being selected during a first situation and the second voltage being selected during a second situation.

10. The electronic apparatus according to claim 9, wherein:
    the first situation is based on the pixel correspond to a selection state;
    the second situation is based on the pixel correspond a non-selection state.

11. The electronic apparatus according to claim 9, wherein the charge store part is a floating diffusion region.

12. The electronic apparatus according to claim 9, wherein the reset switch is configured to reset the charge store element.

13. The electronic apparatus according to claim 9, wherein a gate of the amplifying switch is electrically connected to the charge store element.

14. The electronic apparatus according to claim 9, wherein a gate of the reset switch is electrically connected to a reset line.

15. The electronic apparatus according to claim 9, wherein the transfer switch is configured to transfer a signal charge from the photoelectric conversion element to the charge store element.

16. The electronic apparatus according to claim 15, the photoelectric conversion element is configured to convert incident light into the signal charge.

* * * * *